United States Patent
Wang et al.

(10) Patent No.: US 11,981,216 B2
(45) Date of Patent: May 14, 2024

(54) METHOD AND SYSTEM FOR DETECTING CONTACTOR WELD

(71) Applicant: FORD GLOBAL TECHNOLOGIES, LLC, Dearborn, MI (US)

(72) Inventors: Baojin Wang, Saline, MI (US); Chingchi Chen, Ann Arbor, MI (US); Benjamin A. Tabatowski-Bush, Ann Arbor, MI (US); Aaron Walker, Auburn Hills, MI (US); Rui Wang, Canton, MI (US); Xianzhi Gong, Novi, MI (US); Xu Wang, Northville, MI (US); John Paul Gibeau, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 692 days.

(21) Appl. No.: 17/147,608

(22) Filed: Jan. 13, 2021

(65) Prior Publication Data

US 2022/0219542 A1 Jul. 14, 2022

(51) Int. Cl.
*B60L 3/00* (2019.01)
*G01R 31/00* (2006.01)
*G01R 31/327* (2006.01)

(52) U.S. Cl.
CPC .......... *B60L 3/0046* (2013.01); *G01R 31/006* (2013.01); *G01R 31/3275* (2013.01)

(58) Field of Classification Search
CPC ........ B60L 3/0046; B60L 3/12; B60L 3/0069; G01R 31/006; G01R 31/3275; G01R 31/3277; G01R 31/327

USPC ......................................................... 320/136
See application file for complete search history.

(56) References Cited

U.S. PATENT DOCUMENTS

| | | | | |
|---|---|---|---|---|
| 5,315,221 A * | 5/1994 | Corey | ................. | H01H 47/002 |
| | | | | 318/434 |
| 8,085,515 B2 | 12/2011 | Yugou et al. | | |
| 8,810,991 B2 * | 8/2014 | Scharnick | ............ | H01H 47/005 |
| | | | | 361/115 |
| 8,886,411 B2 * | 11/2014 | Hisazumi | ............. | B62D 5/0481 |
| | | | | 180/443 |
| 8,901,934 B2 * | 12/2014 | Namou | .............. | G01R 31/3278 |
| | | | | 324/423 |
| 9,260,015 B2 * | 2/2016 | Gonzales | .................. | B60L 3/12 |
| 9,520,734 B2 * | 12/2016 | Katou | ................... | H02J 7/0069 |
| 9,645,185 B2 * | 5/2017 | Bagchi | .................. | G01R 31/52 |
| 9,925,933 B2 * | 3/2018 | Hartl | ....................... | B60L 50/51 |
| 10,377,247 B2 * | 8/2019 | Gonzales | ................ | H02J 1/082 |

(Continued)

FOREIGN PATENT DOCUMENTS

CN 113453943 A * 9/2021 ............ B60L 3/0046
EP 3674127 A1 * 7/2020

*Primary Examiner* — M Baye Diao
(74) *Attorney, Agent, or Firm* — David B Kelley; Brooks Kushman P.C.

(57) ABSTRACT

A power system includes a battery and a controller. The controller inhibits charge of the battery according to voltage or current values sensed before and after contactors electrically connected to the battery are commanded to open and indicating that a leakage resistance associated with one of the contactors increases after the one of contactors is commanded to open, and a duration of a continuous voltage drop across another of the contactors after the another of the contactors is commanded to open exceeds a threshold.

18 Claims, 5 Drawing Sheets

(56) References Cited

U.S. PATENT DOCUMENTS

| | | | | |
|---|---|---|---|---|
| 10,516,189 B2* | 12/2019 | Loftus | ............... | H01M 10/44 |
| 10,589,630 B2* | 3/2020 | Qian | ............... | G01R 31/52 |
| 11,077,760 B2* | 8/2021 | Fong | ............... | B60L 53/305 |
| 2010/0025131 A1* | 2/2010 | Gloceri | ............... | B60K 6/52 |
| | | | | 180/65.265 |
| 2012/0161925 A1* | 6/2012 | Gale | ............... | B60L 53/62 |
| | | | | 340/5.1 |
| 2013/0116875 A1* | 5/2013 | Oh | ............... | B60L 53/14 |
| | | | | 701/22 |
| 2014/0354054 A1* | 12/2014 | Katou | ............... | B60L 3/00 |
| | | | | 307/43 |
| 2015/0061376 A1* | 3/2015 | Hartl | ............... | B60L 3/0007 |
| | | | | 307/116 |
| 2015/0097525 A1* | 4/2015 | DeDona | ............... | B60L 1/006 |
| | | | | 320/109 |
| 2015/0191088 A1* | 7/2015 | Gonzales | ............... | B60L 3/0046 |
| | | | | 701/34.2 |
| 2018/0272870 A1* | 9/2018 | Burkman | ............... | H02H 9/001 |
| 2021/0097785 A1* | 4/2021 | Zhang | ............... | G01R 31/3277 |

* cited by examiner

METHOD AND SYSTEM FOR DETECTING CONTACTOR WELD

TECHNICAL FIELD

The present disclosure relates to a system for detecting a contactor weld for an electrified vehicle.

BACKGROUND

Electric vehicles are propelled by electric energy stored in vehicle batteries via switches and contactors. Contactor welding may occur when a large electric current flows through the contactor causing the contactor to remain at a closed position.

SUMMARY

A vehicle includes a traction battery, an electric machine, and a pair of contactors electrically between the traction battery and electric machine. The vehicle also includes a controller that sequentially generates a first command to open one of the contactors and a second command to open the other of the contactors. The controller further inhibits a next start of the vehicle based on voltage or current sensed before and after the first command is generated indicating that a first resistance between a bus electrically connected with the electric machine and a chassis of the vehicle increases after the first command is generated, and a duration of continuous reduction in voltage across the other of the contactors following the second command exceeds a predetermined threshold.

A method includes generating a first command to open a first contactor and a second command to open a second contactor, and inhibiting a next start of a vehicle responsive to voltage or current sensed before and after the generating the first command indicating that a first resistance between an electrical bus and a chassis of the vehicle does not increase after the first command is generated, and a second resistance between the electrical bus and chassis increases after the second command is generated.

A power system includes a battery and a controller. The controller inhibits charge of the battery according to voltage or current values sensed before and after contactors electrically connected to the battery are commanded to open and indicating that a leakage resistance associated with one of the contactors increases after the one of contactors is commanded to open, and a duration of a continuous voltage drop across another of the contactors after the another of the contactors is commanded to open exceeds a threshold.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

The present disclosure, among other things, proposes a system and method for detecting contactor welds for an electrified vehicle.

Figure 1:
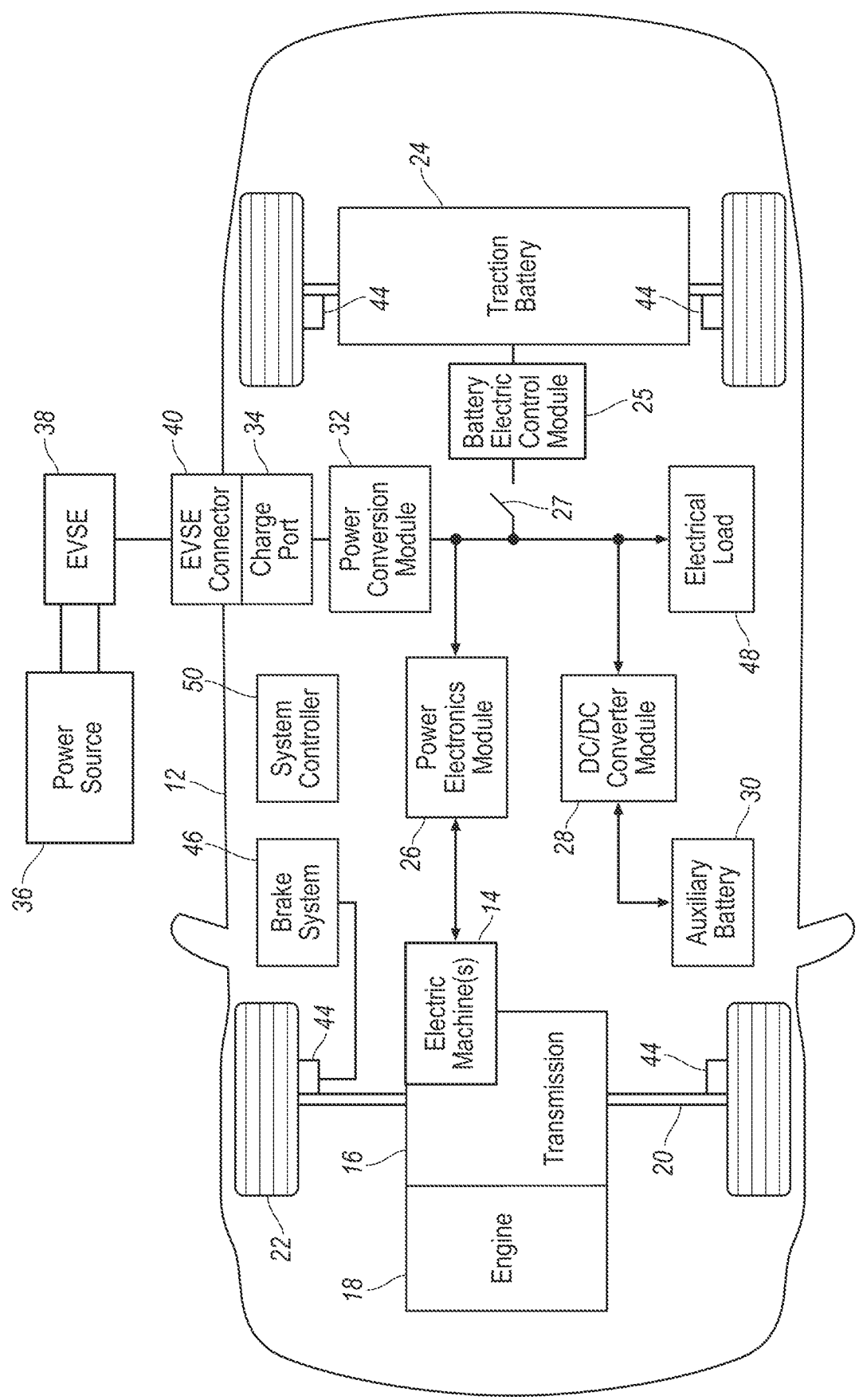
FIG. 1 illustrates an example block topology of an electrified vehicle illustrating drivetrain and energy storage components.

FIG. 1 illustrates a plug-in hybrid-electric vehicle (PHEV). A plug-in hybrid-electric vehicle 12 may comprise one or more electric machines (electric motors) 14 mechanically coupled to a hybrid transmission 16. The electric machines 14 may be capable of operating as a motor or a generator. In addition, the hybrid transmission 16 is mechanically coupled to an engine 18. The hybrid transmission 16 is also mechanically coupled to a drive shaft 20 that is mechanically coupled to the wheels 22. The electric machines 14 may provide propulsion and deceleration capability when the engine 18 is turned on or off. The electric machines 14 may also act as generators and may provide fuel economy benefits by recovering energy that would be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that may be used by the electric machines 14. A vehicle battery pack 24 may provide a high voltage DC output. The traction battery 24 may be electrically coupled to one or more battery electric control modules (BECM) 25. The BECM 25 may be provided with one or more processors and software applications configured to monitor and control various operations of the traction battery 24. The traction battery 24 may be further electrically coupled to one or more power electronics modules 26. The power electronics module 26 may also be referred to as a power inverter. One or more contactors 27 may isolate the traction battery 24 and the BECM 25 from other components when opened and couple the traction battery 24 and the BECM 25 to other components when closed. The power electronics module 26 may also be electrically coupled to the electric machines 14 and provide the ability to bi-directionally transfer energy between the traction battery 24 and the electric machines 14. For example, a traction battery 24 may provide a DC voltage while the electric machines 14 may operate using a three-phase AC current. The power electronics module 26 may convert the DC voltage to a three-phase AC current for use by the electric machines 14. In a regenerative mode, the power electronics module 26 may convert the three-phase AC current from the electric machines 14 acting as generators to the DC voltage compatible with the traction battery 24. The description herein is equally applicable to a pure electric vehicle. For a pure electric vehicle, the hybrid transmission 16 may be a gear box connected to the electric machine 14 and the engine 18 may not be present.

In addition to providing energy for propulsion, the traction battery 24 may provide energy for other vehicle electrical systems. A vehicle may include a DC/DC converter module 28 that converts the high voltage DC output of the traction battery 24 to a low voltage DC supply that is compatible with other low-voltage vehicle loads. An output of the DC/DC converter module 28 may be electrically coupled to an auxiliary battery 30 (e.g., 12V battery).

The vehicle 12 may be battery electric vehicle (BEV) or a plug-in hybrid electric vehicle (PHEV) in which the traction battery 24 may be recharged by an external power source 36. The external power source 36 may be a connection to an electrical outlet. The external power source 36 may be an electrical power distribution network or grid as provided by an electric utility company. The external power source 36 may be electrically coupled to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically coupled to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically coupled may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 46. The brake system 46 may include other components to operate the wheel brakes 44. For simplicity, the figure depicts a single connection between the brake system 46 and one of the wheel brakes 44. A connection between the brake system 46 and the other wheel brakes 44 is implied. The brake system 46 may include a controller to monitor and coordinate the brake system 46. The brake system 46 may monitor the brake components and control the wheel brakes 44 for vehicle deceleration. The brake system 46 may respond to driver commands and may also operate autonomously to implement features such as stability control. The controller of the brake system 46 may implement a method of applying a requested brake force when requested by another controller or sub-function.

One or more electrical loads 46 may be coupled to the high-voltage bus. The electrical loads 46 may have an associated controller that operates and controls the electrical loads 46 when appropriate. Examples of electrical loads 46 may be a heating module, an air-conditioning module or the like.

The various components discussed may have one or more associated controllers to control and monitor the operation of the components. The controllers may communicate via a serial bus (e.g., Controller Area Network (CAN)) or via discrete conductors. A system controller 50 may be present to coordinate the operation of the various components.

Figure 2:
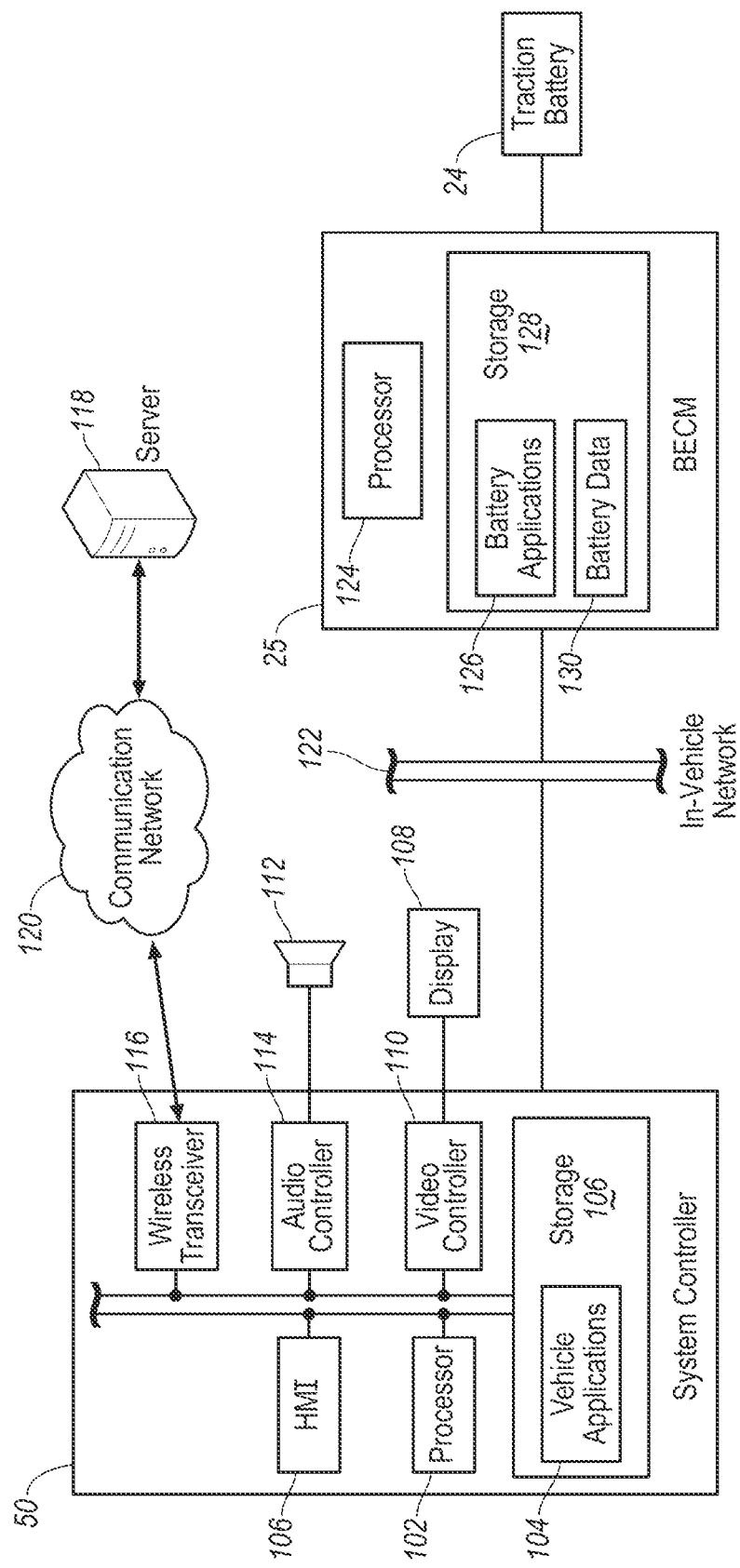
FIG. 2 illustrates an example diagram of a system controller and a battery electric control module.

Referring to FIG. 2, an example diagram for a battery control system including the system controller 50 and the BECM 25 is illustrated. The system controller 50 may include one or more processors 102 configured to perform instructions, commands, and other routines in support of the processes described herein. For instance, the system controller 50 may be configured to execute instructions of vehicle applications 104 to provide features such as navigation, satellite radio decoding, and vehicle power management. Such instructions and other data may be maintained in a non-volatile manner using a variety of types of computer-readable storage medium 106. The computer-readable medium 106 (also referred to as a processor-readable medium or storage) includes any non-transitory medium (e.g., tangible medium) that participates in providing instructions or other data that may be read by the processor 102 of the system controller 50. Computer-executable instructions may be compiled or interpreted from computer programs created using a variety of programming languages and/or technologies, including, without limitation, and either alone or in combination, Java, C, C++, C#, Objective C, Fortran, Pascal, Java Script, Python, Perl, and PL/SQL.

The system controller 50 may be provided with various features allowing the vehicle occupants/users to interface with the system controller 50. For example, the system controller 50 may receive input from human-machine interface (HMI) controls 106 configured to provide for occupant interaction with the vehicle 12. As an example, the system controller 50 may interface with one or more buttons (not shown) or other HMI controls configured to invoke functions on the system controller 50 (e.g., steering wheel audio buttons, a push-to-talk button, instrument panel controls, etc.). The system controller 50 may also drive or otherwise communicate with one or more displays 108 configured to provide visual output to vehicle occupants by way of a video controller 110. In some cases, the display 108 may be a touch screen further configured to receive user touch input via the video controller 110, while in other cases the display 108 may be a display only, without touch input capabilities. The system controller 50 may also drive or otherwise communicate with one or more speakers 112 configured to provide audio output to vehicle occupants by way of an audio controller 114.

The system controller 50 may be further provided with a wireless transceiver 116 configured to communicate with a remote server 118 via a communication network 120. The wireless transceiver 116 may be configured to support a variety of communication protocols including but not limited to Wi-Fi, Bluetooth, radio-frequency identification (RFID), near-field communication (NFC), Zigbee, ultra-wide band (UWB), cellular or the like. The system controller 50 may be configured to receive commands from the remote server 118 operated by a vehicle manufacturer or an associated party to perform various operations to the vehicle 12. For instance, the system controller 50 may receive a command to perform a battery contactor weld test from the server 118 via the wireless transceiver 116. In response, the system controller 50 may proceed with the test by transferring the command to the BECM 25 via an in-vehicle network 122. Responsive to the conclusion of the weld test, the system controller 50 may obtain the test result from the BECM 25 and transmit the result to the remote server 118 via the wireless transceiver 116. The in-vehicle network 122 connecting the system controller 50 and the BECM 25 may include, but not be limited to, one or more of a CAN, an ethernet network, or a media oriented system transport (MOST).

The BECM 25 may include a processor 124 configured to perform instructions, commands, and other routines in support of the processes described herein. For instance, the BECM 25 may be configured to execute instructions of battery application 126 to provide features such as charging, discharging, contactor weld test or the like. Such instructions and other data may be maintained in a non-volatile manner using a variety of types of computer-readable storage medium 128. Data log (e.g. test results) may be maintained in the storage 128 as a part of battery data 130.

Figure 3:
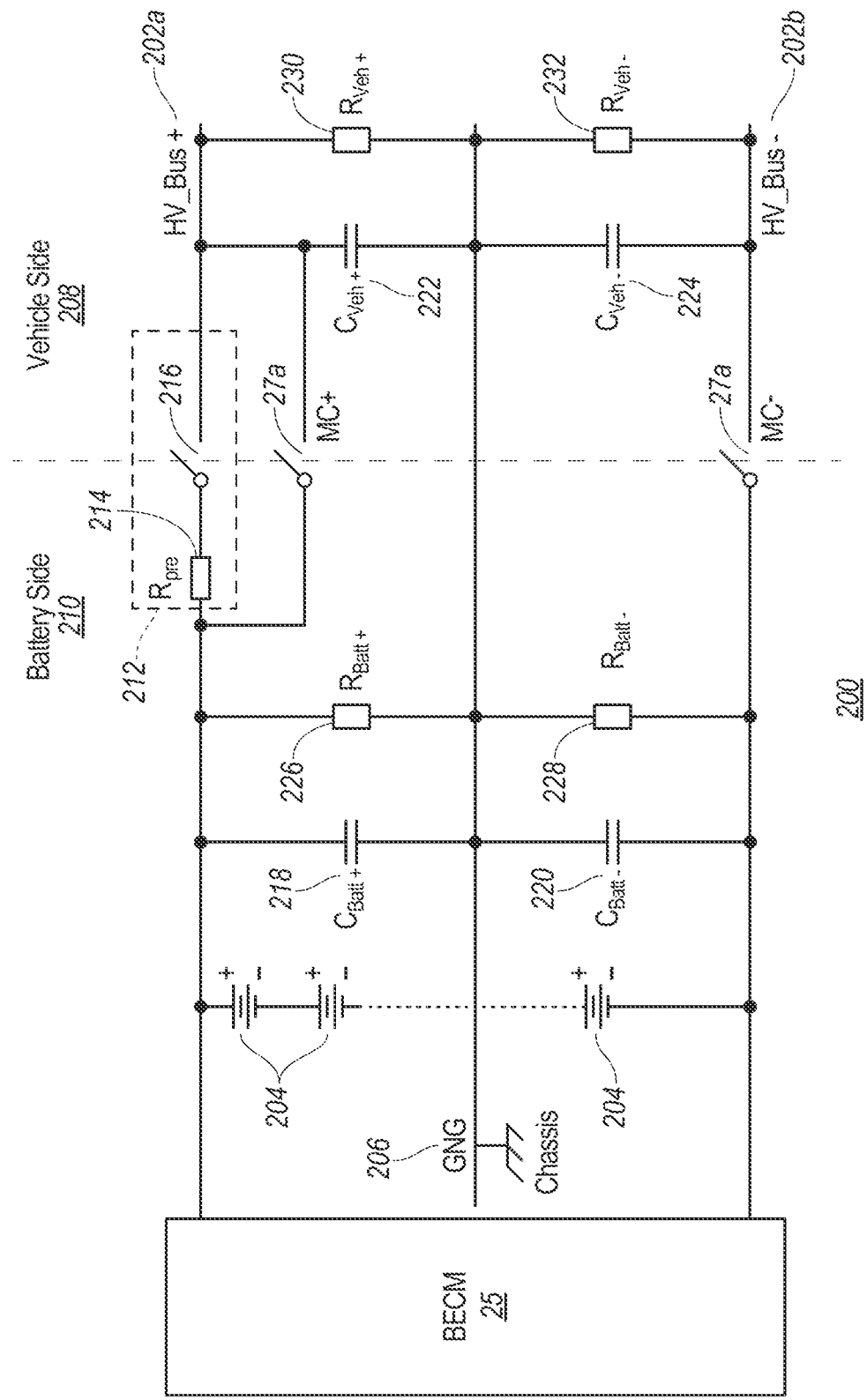
FIG. 3 illustrates an example circuit diagram of a contactor weld detecting circuit.

Referring to FIG. 3, an example circuit diagram of a battery contactor weld detection circuit 200 of one embodiment of the present disclosure is illustrated. With continuing reference to FIGS. 1 and 2, the BECM 25 may be connected to a positive high-voltage (HV) bus/rail 202a and negative HV bus/rail 202b. A plurality of high-voltage (HV) battery cells 204 may be connected in series between the positive and negative HV buses 202a and 202b. It is noted that although the battery cells 204 are connected in series in the present example, other configurations may be used. The plurality of battery cells 204 may be connected in parallel, in series, and/or in the combination thereof. The circuit 200 may further include a ground line 206 to which the chassis of the vehicle 12 is connected. As discussed above, one or more contactors 27 may be connected between the vehicle 12 and the battery 24. In the present example, a positive main contactor MC+ 27a may be disposed on the positive HV bus 202a and a negative main contactor MC− 27b may be disposed on the negative HV bus 202b, and the main contactors 27a and 27b may divide the circuit 200 into a vehicle side circuit 208 and a battery side circuit 210. A precharge circuit 212 may be disposed on either or both of the positive and negative HV buses 202a and 202b. In the present example, as illustrated in FIG. 3, the precharge circuit 212 may be disposed on the positive HV bus 202a connected in parallel with the positive main contactor 27a. The precharge circuit 212 may include a precharge resistor 214 and a precharge contactor 216 connected in series.

The main contactors 27 and the precharge contactors 216 may be of various types. As an example, the contactors may be of a magnetic contactor type influenced by a low power/low voltage (LV) circuit (not shown) controlled by the BECM 25. The contactor may be spring loaded. In an inactive condition, the spring may apply a tension between a contactor core (not shown) and a contactor coil (not shown) urging the contactor to open so the electricity cannot flow through. The core and coil may be referred to as the first and second terminal of the contactor. Responsive to the low power circuit being activated by the BECM 25, electricity flows through the magnetic contactor. The electromagnet may generate a magnetic field overwhelming the spring tension so that the core contacts the coil so that the contactor is closed. To open the contactor, the BECM 25 may deactivate the low power circuit such that the magnetic field disappears and spring tension may urge the terminals to separate which opens the contactor. An electrical arc may be created during the closing process between contactor terminals as they move closer to each other. The high temperature of electrical arc may cause contactor terminals to melt and weld together. In this case, the spring tension may be unable to separate the contactor terminals which may cause unintended connection between the battery 24 and the vehicle 12. While the main contactors 27a and 27b may have a higher chance to experience contactor welds, the precharge contactor 216 may be less likely to encounter such an issue because of a reduced current due to the precharge resistor 214. For instance, the precharge resistor 214 may have a value of hundreds of ohms.

As illustrated in FIG. 3, a variety of capacitors and resistors may be connected between the HV buses 202 and the ground/chassis on both the vehicle side circuit 208 and the battery side circuit 210. The capacitors and resistors may in the present example may represent lumped capacitance and resistance caused by parasitic effects and/or circuit components shown or not shown on each respective part of the circuit 200. For instance, a positive battery capacitor $C_{Batt+}$ 218 may be connected between the positive HV bus 202a and the ground 206 on the battery side circuit 210. A negative battery capacitor $C_{Batt−}$ 220 may be connected between the negative HV bus 202b and the ground 206 on the battery side circuit 210. A positive vehicle capacitor $C_{Veh+}$ 222 may be connected between the positive HV bus 202a and ground the 206 on the vehicle side circuit 208. A negative vehicle capacitor $C_{Veh−}$ 224 may be connected between the negative HV bus 202b and the ground 206 on the vehicle side circuit 210. A positive battery resistor $R_{Batt+}$ 226 may be connected between the positive HV bus 202a and the ground 206 on the battery side circuit 210. A negative battery resistor $R_{Batt−}$ 228 may be connected between the negative HV bus 202b and the ground 206 on the battery side circuit 210. A positive vehicle resistor $R_{Veh+}$ 230 may be connected between the positive HV bus 202a and the ground 206 on the vehicle side circuit 208. A negative vehicle resistor $R_{Veh−}$ 232 may be connected between the negative HV bus 202b and the ground 206 on the vehicle side circuit 210. The lumped resistors/resistance described herein may also be referred to as leakage resistors/resistance. The lumped capacitor introduced above may be caused by parasitic capacitance on each of the battery and vehicle sides. Additionally or alternatively, one or more extra capacitors may be added to the circuit (e.g. on the vehicle side) to satisfy the specific design need. The lumped capacitors/capacitance may also be referred to as Y capacitors/capacitance. The value of each lumped capacitors may vary depending on design need. However, it may be generally recognized that the lumped capacitor on the battery side circuit 210 is much smaller than the lumped capacitor on the vehicle side circuit 208. As an example, the total lumped capacitance on the battery side maybe less than 100 nF whereas the lumped capacitance on the vehicle side may be more than 1000 nF. Due to the significant difference in the capacitance values, the contactor weld detection may be made using the characteristics of the circuit based on RC dynamics of the circuit 200 (to be discussed in detail below).

Figure 4:
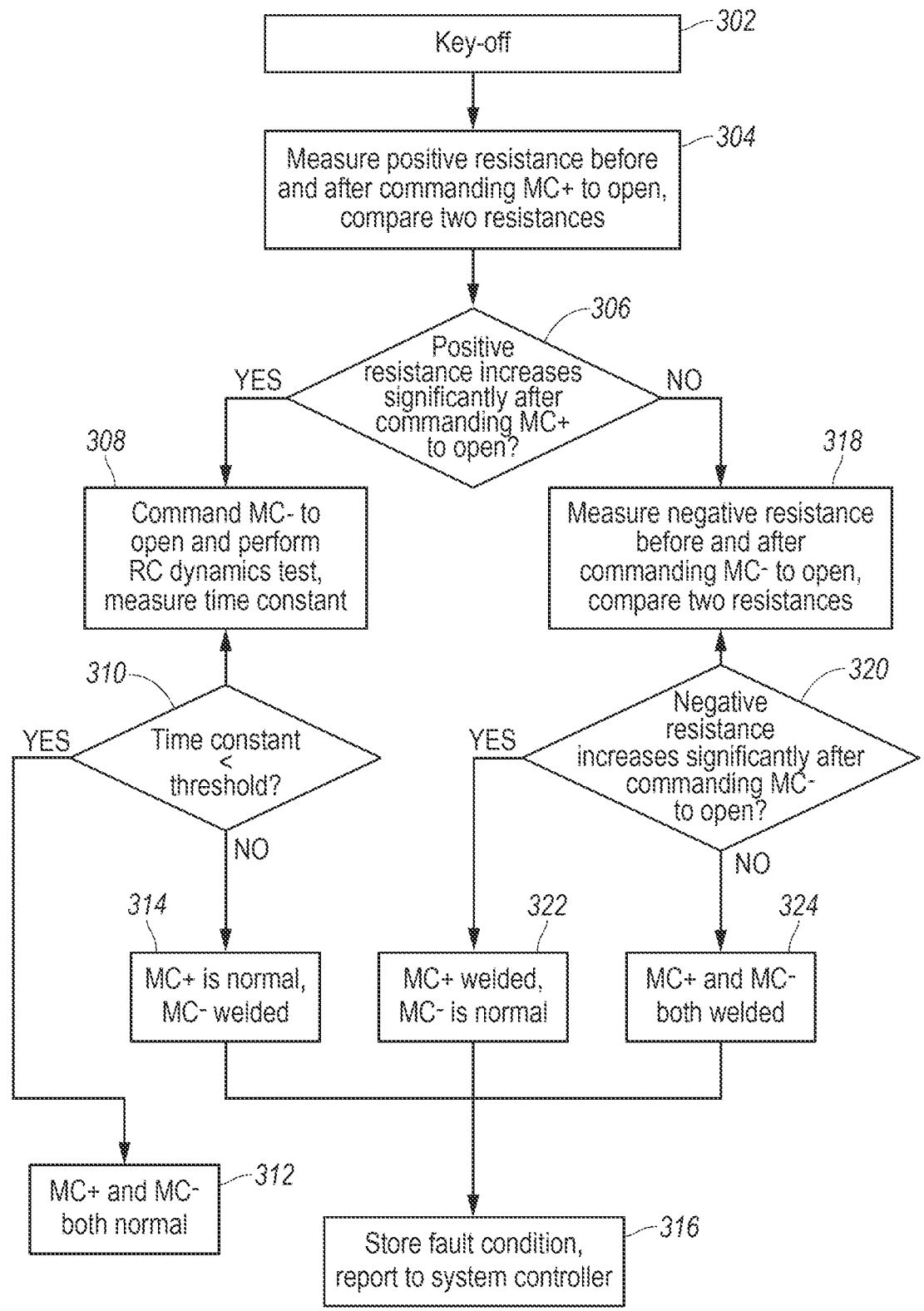
FIG. 4 illustrates an example flow diagram of a process for contactor weld detection.

Referring to FIG. 4, an example flow diagram of a process 300 for a contactor weld detection process is illustrated. In the present example, the process 300 may be performed after the vehicle 12 is being used. Both the main contactors 27 are closed and the precharge contactor 216 is open in the vehicle normal operating condition. With continuing reference to FIGS. 1-3, responsive to a key-off action after a user uses the vehicle 12 at operation 302, at operation 304, the BECM 25 starts the contactor weld detection by first measuring a positive leakage resistance between the positive HV bus 202a and ground 206 while both the main contactors 27 are still closed. As illustrated with reference to FIG. 3, a value of the leakage resistance between the positive HV bus 202a and ground 206 may be calculated using the following equation as the positive battery resistor $R_{Batt+}$ 226 and the positive vehicle resistor $R_{Veh+}$ 230 are connected in parallel.

$$R_{leak\_closed+} = \frac{R_{Batt+} \times R_{Veh+}}{R_{Batt+} + R_{Veh+}}$$

Next, the BECM 25 commands to open the positive main contactor MC+ 27a and measures the positive leakage resistance again. At operation 306, the BECM 25 compares the leakage resistances measured before and after the positive main contactor MC+ 27a has been commanded to open to determine if there is a significant change in the resistance value. If the positive main contactor MC+ 27a is in a normal operating status and open, the vehicle side leakage resistance $R_{Veh+}$ 230 should be disconnected from the BECM 25 and therefore the new positive leakage resistance $R_{leak\_open+}$ should be substantially equal to the positive battery resistance $R_{Batt+}$ 226. In general, the new leakage resistance $R_{leak\_open+}$ measured when the positive main contactor MC+ 27a is open should be significantly greater than the previously measured resistance $R_{leak\_closed+}$. If the BECM 25 determines that is the case, indicating the positive main contactor MC+ 27a is operating normally, the process proceeds to operation 308. Otherwise, the process proceeds to operation 318. It is noted there are various methods to determine the increase in the leakage resistance before and after the main contactor 27a opens. For instance, the BECM 25 may directly compare the two values to determine if the later measured value is greater than the earlier measured value. Alternatively, magnitude threshold may be applied to the comparison process to prevent false readings due to the system glitches. The magnitude threshold may be a fixed threshold (e.g. 10-30 kΩ) and the BECM 25 may only determine the significant increase if the later measured resistance value is greater than the earlier measured value by at least the magnitude threshold (i.e. $R_{leak\_open+}$> $R_{leak\_closed+}+R_{threshold}$). Alternatively, a dynamic magnitude threshold may be applied. The dynamical magnitude threshold may be a percentage of the earlier measured capacitance value. As an example, the BECM 25 may only determine the significant increase responsive to the later measured value is greater than the earlier measured value by more than 30% (i.e. 30% being the threshold).

Figure 5:
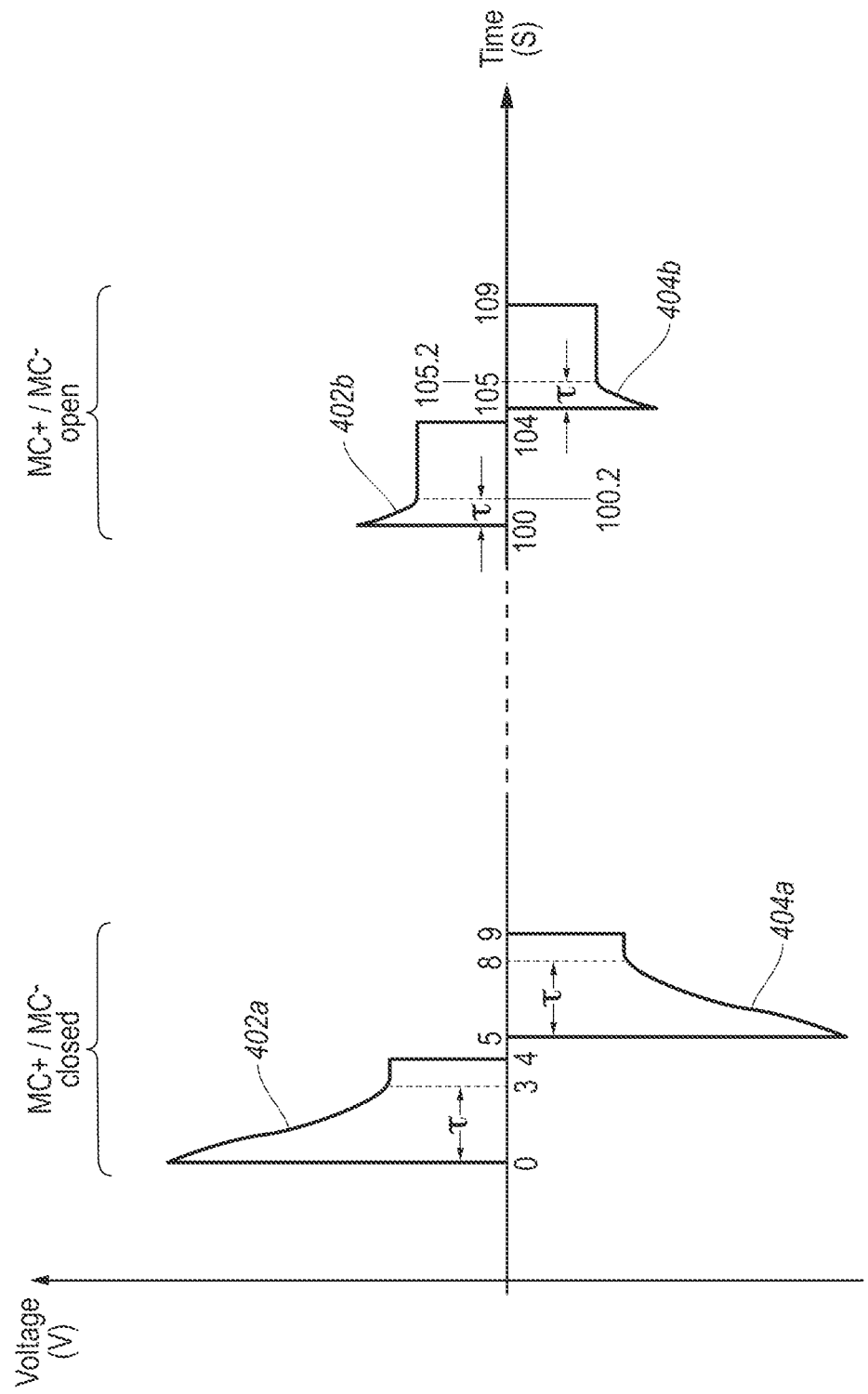
FIG. 5 illustrates an example waveform diagram of RC dynamics of a contractor weld detection process.

At operation 308, the BECM 25 further determines if the negative main contactor MC– 27b is welded by analyzing the RC dynamics of the circuit 200. In the present example, a time constant parameter τ characterizing a circuit signal response to stabilization is used to make the RC dynamics determination. One or more leakage detection signals may be directly or indirectly measured from the HV buses 202 through a leakage detection circuit (isolation detection circuit, not shown) responsive to a test/trigger command. Depending on the specific configuration of the testing circuit, the leakage detection signals may vary signification. However, the signals may generally resemble a similar characteristic of a stabilization process. Referring to FIG. 5, a leakage detection signal waveform diagram 400 is illustrated. While the waveform from 0 to 9 seconds in time illustrates the leakage detection signals when the main contactors 27 are closed, the waveform from 100 to 109 seconds illustrates the leakage detection signals when the main contactors 27 are open. The waveform 402 may represent the leakage on the positive HV bus 202a influenced by the status of the positive main contactor MC+ 27a, and the waveform 404 may represent the leakage on the negative HV bus 202b influenced by the status of the negative main contactor MC– 27b. Taking the waveform 404a for instance, the negative leakage detection signal lasts 4 seconds from 5 to 9 s when the negative main contactor MC– 27b is closed. The magnitude of the signal 404a starts high and gradually reaches a stable status at around 8 s. The stabilization process between 5 and 8 s may be referred to as a time constant parameter represented by τ. The time constant parameter τ may be calculated using the equation below:

$$\tau = R \times C$$

As discussed above with reference to FIG. 3, since the lumped capacitance $C_{Veh}$ on the vehicle side circuit 208 is significantly greater than the lumped capacitance $C_{Batt}$ on the battery side circuit 210 (at least 10 times more), the value of the time constant τ will heavily depend on whether the vehicle side circuit 208 is connected to the main circuit 200. Taking the waveform 404 for instance, the time constant τ (i.e. 4 s) as illustrated in the waveform 404a when the negative main contactor MC– 27b is closed connecting the negative vehicle capacitor $C_{Veh-}$ to the circuit 200 is significantly greater than the time constant τ (i.e. 0.2 s) as illustrated in the waveform 404b when the negative main contactor MC– 27b is open separating the negative vehicle capacitor $C_{Veh-}$ from the circuit 200. Due to the significant difference in the time constant as calculated, a threshold (e.g. 1 s) may be used to determine the status of the main contactors.

Returning to FIG. 4, at operation 310, the BECM 25 determines if the time constant τ as calculated is less than the predetermined time threshold. If the answer is a yes, indicating the negative main contactor MC– 27b is open, the process proceeds to operation 312 to proceeds with the normal key-off procedure. Otherwise, if the answer for operation 310 is a no, the process proceeds to operation 314 to flag the possible welding of the negative main contactor MC– 27b. Since the positive main contactor MC+ 27a has already been determined to be open at operation 306, the BECM 25 may only flag the fault for the negative main contactor MC– 27b at operation 314. At operation 316, the BECM 25 may store the fault condition as detected and report the condition to the system controller 50 for further processing. The system controller 50 may output a message via the HMI controls 106 to notify the condition to the vehicle user. Additionally or alternatively, the system controller 50 may report the condition to the remote server 118 via the wireless transceiver 116. The BECM 25 may be further configured to inhibit the vehicle 12 from starting and/or the battery 24 being charged/discharged responsive to one of the main contactors being welded.

Returning to operation 306, if the BECM 25 fails to detect a significant increase in the positive leakage resistance, the process proceeds to operation 318 to further determine the status of the negative main contactor MC– 27b by measuring the leakage resistance between the negative HV bus 202b and the ground 206 before and after commanding to open the negative main contactor MC– 27b and determining if there is a significant increase in the leakage resistance as measured. The negative leakage resistance detection procedures at operation 318 and 320 are substantially similar to the procedures in operation 304 and 306. If the BECM 25 determines a significant increase in the negative leakage resistance before and after opening the negative main contactor MC– 27b, the process proceeds to operation 322 to flag a possible welding of the positive main contactor MC+ 27a. Otherwise the process proceeds to operation 324 to flag both the main contactors 27 are possibly welded.

It should be noted that the process 300 as discussed above is merely introduced as an example of the present disclosure and the detailed process, operations and steps may vary depending on the specific design need. For instance, the process 300 may be altered to start with the negative main contactor detection first under substantially the same principle. The process at operation 308 and 310 may be referred to as a quick contactor weld detection process applicable to both the positive and negative main terminals. The quick contactor detection process may be independently performed responsive to a key-in input indicative of a user intent to start to use the vehicle 12.

While exemplary embodiments are described above, it is not intended that these embodiments describe all possible forms of the invention. Rather, the words used in the specification are words of description rather than limitation, and it is understood that various changes may be made without departing from the spirit and scope of the invention. The word "increases" as used in the claims, for example, may refer to increases of at least 15%, 20%, etc. of the previous value. The phrase "does not change," for example, may also refer to values that are within 5%, 10%, etc. of each other. Percentage values for particular applications can be obtained via testing, simulation, etc. Additionally, the features of various implementing embodiments may be combined to form further embodiments of the invention.

What is claimed is:

1. A vehicle comprising:
a traction battery;
an electric machine;
a pair of contactors electrically between the traction battery and electric machine; and
a controller programmed to sequentially generate a first command to open one of the contactors and a second command to open the other of the contactors, and to inhibit a next start of the vehicle based on (i) voltage or current sensed before and after the first command is generated indicating that a first resistance between a bus electrically connected with the electric machine and a chassis of the vehicle increases after the first command is generated and (ii) a duration of continuous reduction in voltage across the other of the contactors following the second command exceeds a predetermined threshold.

2. The vehicle of claim 1, wherein the controller is further programmed to permit a next start of the vehicle based on (i) the voltage or current sensed before and after the first command is generated indicating that the first resistance increases after the first command is generated and (ii) the duration of continuous reduction in voltage across the other of the contactors following the second command does not exceed the predetermined threshold.

3. The vehicle of claim 2, wherein the controller is further programmed to generate output indicating the contactors are open.

4. The vehicle of claim 1, wherein the controller is further configured to generate output indicating the other of the contactors is welded closed.

5. The vehicle of claim 1, wherein the controller is further programmed to inhibit a next start of the vehicle based on the voltage or current sensed before and after the first command is generated indicating that the first resistance does not increase after the first command is generated, and a second resistance between the bus and chassis increases after the second command is generated.

6. The vehicle of claim 5, wherein the controller is further programmed to generate output indicating the one of the contactors is welded closed.

7. The vehicle of claim 1, wherein the controller is further programmed to inhibit a next start of the vehicle based on the voltage or current sensed before and after the first command is generated indicating that the first resistance does not increase after the first command is generated, and a second resistance between the bus and chassis does not increase after the second command is generated.

8. The vehicle of claim 7, wherein the controller is further programmed to generate output indicating the other of the contactors is welded closed.

9. A method comprising:
generating a first command to open a first contactor and a second command to open a second contactor; and
inhibiting a next start of a vehicle responsive to voltage or current sensed before and after the generating the first command indicating that a first resistance between an electrical bus and a chassis of the vehicle does not increase after the first command is generated, and a second resistance between the electrical bus and chassis increases after the second command is generated.

10. The method of claim 9 further comprising generating output indicating the first contactor is welded closed.

11. The method of claim 9 further comprising inhibiting a next start of the vehicle responsive to the voltage or current sensed before and after the generating the first command indicating that the first resistance does not increase after the first command is generated, and a second resistance between the electrical bus and chassis does not increase after the second command is generated.

12. The method of claim 11 further comprising generating output indicating the first and second contactors are welded closed.

13. The method of claim 9 further comprising inhibiting a next start of the vehicle responsive to the voltage or current sensed before and after the generating the first command indicating that the first resistance increases after the first command is generated, and a duration of continuous reduction in voltage across the second contactor following the second command exceeds a predetermined threshold.

14. The method of claim 13 further comprising generating output indicating the second contactor is welded close.

15. The method of claim 9 further comprising permitting a next start of the vehicle responsive to the voltage or current sensed before and after the generating the first command indicating that the first resistance increases after the first command is generated, and a duration of continuous reduction in voltage across the second contactor following the second command does not exceed a predetermined threshold.

16. The method of claim 15 further comprising generating output indicating the first and second contactors are open.

17. A power system comprising:
a battery; and
a controller programmed to
inhibit charge of the battery according to voltage or current values sensed before and after contactors electrically connected to the battery are commanded to open and indicating that a leakage resistance associated with one of the contactors does not increase after the one of contactors is commanded to open, and a leakage resistance associated with another of the contactors increases after the another of the contactors is commanded to open, and a duration of a continuous voltage drop across another of the contactors after the another of the contactors is commanded to open exceeds a threshold.

18. The power system of claim 17, wherein the controller is further programmed to inhibit charge of the battery according to the voltage or current values sensed before and after the contactors are commanded to open and indicating that the leakage resistance associated with the one of the contactors does not increase after the one of contactors is commanded to open, and a leakage resistance associated with another of the contactors does not increase after the another of the contactors is commanded to open.

* * * * *